United States Patent [19]

Hu

[11] 4,053,335
[45] Oct. 11, 1977

[54] METHOD OF GETTERING USING BACKSIDE POLYCRYSTALLINE SILICON

[75] Inventor: Shih-Ming Hu, Hopewell Junction, N.Y.

[73] Assignee: International Business Machines Corporation, Armonk, N.Y.

[21] Appl. No.: 672,906

[22] Filed: Apr. 2, 1976

[51] Int. Cl.² .................... H01L 21/324; H01L 29/04
[52] U.S. Cl. ..................................... 148/174; 148/1.5;
148/175; 156/612; 357/52; 357/59; 357/64;
427/82; 427/86
[58] Field of Search ......................... 148/1.5, 174, 175;
156/612; 357/52, 59, 64; 427/82, 86

[56] References Cited

U.S. PATENT DOCUMENTS

| | | | |
|---|---|---|---|
| 2,841,510 | 7/1958 | Mayer | 148/1.5 |
| 3,370,980 | 2/1968 | Anderson | 148/175 X |
| 3,494,809 | 2/1970 | Ross | 148/175 |
| 3,632,438 | 1/1972 | Carlson et al. | 357/52 X |
| 3,694,276 | 9/1972 | Wakamiya et al. | 148/174 |
| 3,723,201 | 3/1973 | Keil | 148/175 |
| 3,745,423 | 7/1973 | Hiroyuki | 357/59 X |
| 3,862,852 | 1/1975 | Kamins | 148/174 X |
| 3,871,007 | 3/1975 | Wakamiya et al. | 357/59 X |
| 3,900,597 | 8/1975 | Chruma et al. | 427/82 |
| 3,929,529 | 12/1975 | Poponiak | 148/175 X |
| 3,997,368 | 12/1976 | Petroff et al. | 148/1.5 |

OTHER PUBLICATIONS

Gates, H.R., "Gettering Process for Wafer Defect Reduction" I.B.M. Tech. Discl. Bul., vol. 15, No. 6, Nov. 1972, p. 177.

*Primary Examiner*—L. Dewayne Rutledge
*Assistant Examiner*—W. G. Saba
*Attorney, Agent, or Firm*—George O. Saile

[57] ABSTRACT

An integrated circuit structure and method for manufacturing same which provides for gettering with a backside layer of polycrystalline silicon. The gettering of unwanted impurities from the integrated circuits involves the deposition of a polycrystalline silicon film on a semiconductor wafer prior to any or some high temperature processing steps. The semiconductor body is then subjected to the normal semiconductor processing steps to form semiconductor devices on the surface opposite to the surface having the polycrystalline silicon layer. During these high temperature processing steps, unwanted impurities such as copper, iron, nickel, sodium and potassium ions move toward and into the polycrystalline silicon layer and thereby away from the semiconductor devices. This produces improved yield in the integrated circuit process.

11 Claims, 8 Drawing Figures

METHOD OF GETTERING USING BACKSIDE POLYCRYSTALLINE SILICON

BACKGROUND OF THE INVENTION

The invention relates to methods and resulting structures for manufacturing integrated circuits wherein unwanted impurities are gettered from the device regions to a region away from the devices.

DESCRIPTION OF THE PRIOR ART

An economical determinant of integrated circuit process technology is the yield, that is the percentage of the total number of chips processed that are good. Often, bad chips are caused by devices wherein they fail to operate because of excessive leakage currents. The yield of complex integrated circuits is typically a few percent. One major factor that affects this yield is the presence of crystal defects in silicon, or other semiconductor wafers on which integrated circuits are built. These crystal defects can be classified into two kinds: the native defects, such as dislocations, stacking faults, and clusters of self-interstitials and vacancies; and the extraneous defects, such as contaminants of elements different from the semiconductor substrates. Dislocations are introduced in high temperature processing because of non-ideal thermal conditions (see for example, S. M. Hu, in J. Appl. Phys. 40, 4413 (196); K. Morezane and P. S. Gleim, J. Appl. Phys. 40, 4104 (1969); S. M. Hu, App., Phys. Lett. 22, 261 (1973)), whereas stacking faults are introduced either during epitaxial growth when the substrates are not appropriately cleaned (see, for a review, B. A. Joyce, Rept. Prog. Phys. 37, 363-420 (1974), or during thermal oxidation when the substrates contain other kinds of point defect clusters serving as nucleation sites (see, for example, D. J. D. Thomas, Phys. Stat. Solidi 3, 2261 (1963); S. M. Hu, J. Appl. Phys. 45, 1567 (1974); S. M. Hu, Appl. Phys. Lett. 27, 165 (1975). Clean native defects, in general, are not harmful electrically by themselves to any practical extent. However, they interact with extraneous impurities and become harmful. One example is the formation of transistor "pipes", commonly though as formed by enhanced diffusion of emitter or subcollector dopants along dislocations traversing transistor bases (for example, see F. Barson, M. S. Hess and M. M. Roy, J. Electrochem. Soc. 116, 304 (1969); G. H. Plantinga, IEEE Trans. Electron Devices ED-16, 394 (1969)). Another example is the role of vacancy/interstitial clusters, stacking faults, and dislocations serving as nucleation centers for the precipitation of fast diffusing impurities such as copper (for example, see S. M. Hu and M. R. Poponiak, J. Appl. Phys. 43, 2067 (1972); Phys. Stat. Solidi (a) 18, KS, (1973)), and other fast diffusing impurities such as iron, nickel, gold, etc.

As early as 1960, it was recognized that precipitates of such fast diffusing impurities as copper, iron, nickel, etc. may act to facilitate the recombination/generation of electron-hole pairs, leading to excessively high reverse leakage currents. With this recognition, Goetzberger and Shockley (J. Appl. Phys. 31, 1831 (1960)) first suggested the use of boron or phosphorus doped silicate glass layers to getter these detrimental impurities (see also, S. W. Ing., Jr., et al. J. Electrochem. Soc. 110, 533 (1963)).

As the integrated circuit processing becomes more complex and lengthy, the chances of contamination, during each of the processing steps, become greater and greater. To rely on the high purity of the starting wafers and the meticulous cleanliness is no longer without risk. Therefore, other gettering processes have been proposed. These include the diffusion of phosphorus or boron into the silicon wafers, for examples, see M. R. Poponiak, W. A. Keenan, and R. O. Schwenker, in Semiconductor Silicon/1973, H. R. Huff and R. R. Burgess, editors, p. 701, Electrochemical Society Softbound Symposium Series, Princeton, N. J.; R. L. Meek, T. E. Seidel and A. G. Cullis, J. Electrochem. Soc. 122, 786 (1975); J. L. Lambert and M. Reese, Solid-State Electron. 11, 1055 (1968); mechanical damages on the wafer backsides, for examples, see E. J. Metz, J. Electrochem. Soc. 112, 420 (1965) and J. E. Lawrence U.S. Pat. No. 3,905,162, Sept. 16, 1975; ion implantation, for example, see T. M. Buck, K. A. Pickar, J. M. Poate and C. M. Hsieh, Appl. Phys. Lett. 20, 485 (1972); Appl. Phys. Lett. 22, 238 (1973) and "Impact Sound Stressing for Semiconductor Devices", filed Sept. 10, 1975 by G. Schwuttke et al. All these methods involve, in one form or another, certain disorders worked into the substrates. Such disorders, mechanical damages in particular, can often propagate through the silicon wafers into the active device areas unless later thermal processes are carried out under extremely idealized conditions that are often not met. (For example, S. M. Hu, 3rd Ann. Conf. Crystal Growth, Palo Alto, Calif., July 13-17, 1975. Conf. Program Abstr. pp. 149-150 (1975)). Such damages are also difficult to quantify and control. In the case of ion implantation damages, the damaged layers are often too shallow, and may be easily removed during such later processing as oxidation and etching. Furthermore, improper thermal processing may often anneal out such implantation damages, making later thermal processing procedure not easily optimized or compatible.

Silicon nitride is an effective barrier to the penetration of impurities into the surface of a semiconductor body. U.S. Pat. No. 3,494,809 to C. A. Ross entitled "Semiconductor Processing" suggests the use of silicon nitride on the backside of semiconductor wafers during epitaxial growth on the front surface of the wafer, oxidation, etching and diffusion steps.

The capacity of gettering provided by such above mentioned gettering layers is often very limited and cannot be readily extended. For example, if the damage is in the form of dislocation networks, the gettering action would strongly depend on the precipitation of the harmful impurities on the dislocations which act as nucleation sites, rather than chemical bonding to the dislocations or the formation of Cottrell atmospheres as claimed by some investigators. This is because dislocatons are lines with very little capacity for holding large amounts of impurity atoms. A gettering procedure tha is based on precipitation of the impurities cannot be effective at higher temperatures, where impurity solu bilities are high. The impurities can be released agaii during subsequent high temperature processings such a epitaxial growth and diffusion operations, leading to th formation of epitaxial defects and diffusion pipes. A limited gettering capacity will also mean that for lengthy, complicated device fabrication process, th gettering layer would not be able to carry throug effectively from the beginning to the end of the entir process.

SUMMARY OF THE PRESENT INVENTION

In accordance with the present invention, integrated circuit yield is increased by use of a polycrystalline silicon layer on the side of the semiconductor body opposite to that of the surface having the integrated circuit devices. The polycrystalline silicon film can cover the entire back surface of the semiconductor body. Considering this large area of polycrystalline silicon and the small grain size of the polycrystalline silicon film, the film makes an almost perfect sink for gettering impurities such as copper, lithium, sodium, potassium, iron, cobalt, nickel, chromium, and gold.

Polycrystalline silicon gettering is based on the preferred segregation of impurities at the polycrystalline boundaries, and hence remains effective during high temperature processing. The grain boundaries cannot be annealed out at least up to 1200° C. The grain boundary area can be easily controlled by the deposition of desired thickness of the polycrystalline silicon layers. This means that the polycrystalline silicon layers can carry their gettering action effectively throughout the entire processing procedure. Polycrystalline silicon, either undoped or suitably doped with oxygen, is inherently compatible with the silicon substrates, and hence induce negligible stresses in the substrate. Because polycrystalline boundaries are not coherent with the cleavage planes of the silicon substrate and that they do not introduce stress singularities in the substrates, the polycrystalline silicon film will not generate dislocations under thermal stressing as would mechanically or otherwise damaged layers in the substrates themselves. The polycrystalline layer can be allowed to remain on the integrated circuit device during their lifetime without fear of stress failures.

In some cases it is preferable to cover the polycrystalline silicon film with a contaminant impervious film such as silicon nitride, aluminum trioxide, silicon oxinitride and the like or any combination thereof with or without an intermediary silicon dioxide. This is particularly useful where it is desired to grow an epitaxial film on the surface of the semiconductor body opposite to the polycrystalline silicon. In this situation the polycrystalline side of the semiconductor body would come into contact with the susceptor of the epitaxial reactor. The susceptor of the epitaxial reactors can be a massive source of impurities which would in turn move into the polycrystalline silicon during the high temperature epitaxial growth reaction. Thus, the gettering capacity of the polycrystalline film could be overwhelmed by such a contamination. The presence of a contaminant impervious film prevents such movement of outside impurities into the polycrystalline film.

DESCRIPTION OF THE PREFERRED EMBODIMENTS

Figure 1:
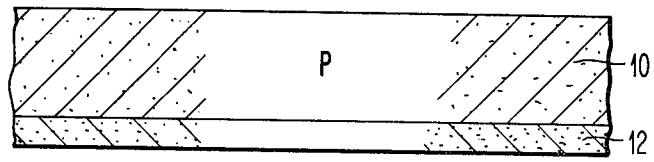
FIG. 1 illustrates a cross-section of a semiconductor body having a polycrystalline film on one major surface thereof.

Referring now more particularly to FIG. 1, there is shown a monocrystalline semiconductor body 10 composed of, for example, p-type silicon. Formed thereon is a polycrystalline silicon layer 12. Various silicon-containing gases may be used to deposit polycrystalline silicon films. The deposition may involve the hydrogen reduction of silicon tetrachloride or the use of silane or dichlorosilane. The latter two materials are preferred because of their lower reaction temperatures. The gases are passed over the surface of the heated semiconductor body and the reaction occurs at or near the surface where the polycrystalline silicon is thereby grown. In addition to the use of nitrogen carrier gas, hydrogen and other inert gases such as argon may also be used to suitably dilute and carry the silane to or past the heated semiconductor body or wafer.

The polycrystalline silicon deposition temperature has a diverse number of effects and must be optimized for suitable use in gettering. At higher deposition temperatures, above about 800° C, the grain size of the polycrystalline silicon is quite large, and consequently results in lower gettering efficiency for a given thickness of polysilicon layer. On the other hand, there are at least three drawbacks in deposition at lower temperatures. First, the deposition rate decreases quite rapidly as the deposition temperature becomes lower. For example, for a given gas phase composition and flow rate, the deposition rates are about 100 A per min. at 600° C, about 230 A per min. at 650° C, about 330 A per min. at 700° C, and about 450 A per min. at 750° C. ($\pm$ 10% fluctuations from these quoted values are typical). It thus makes deposition at lower temperatures economically impractical, unless in some way compensated by varying the gas composition which would result in polysilicon films of quite different structures. The second problem from low temperature deposition is the phenomenon of "creeping". The term "creeping" is used here specifically to denote the phenomenon that polycrystalline silicon will form not only on the exposed surfaces (backsides of wafers) of the wafers, but also on the bottom surfaces (frontsides of wafers) that are in physical contact with the pyrolytic susceptor, extending from the edges of the wafers to some distance into the interiors of the wafers, thus reducing the useful area of the wafers on which integrated circuits are built. Creeping is caused by the diffusion of silane molecules, or other silicon-bearing molecules into the gap between the bottom surface and the susceptor, thereby depositing polysilicon along the way until the silane is exhausted. At higher deposition temperatures, the pyrolysis is very fast and the silane will be exhausted in a shorter distance from the wafer edge.

The third effect is stress in the polycrystalline film. At temperatures less than about 680° C, the deposited film has high stress of the order of 20,000 psi or more. A corresponding stress will then be introduced to the silicon substrate which can cause wafer warpage and/or dislocation propagation. Deposition at temperatures higher than about 680° C results in many-fold decrease in stress.

The thickness of the polycrystalline film is preferably between about 5,000 to 30,000 Angstroms. The thickness is not a problem because of the inherent compatibility of the polycrystalline silicon film to the monocrystalline silicon substrate and may be extended if desired. However, a small amount of film stress does exist, as described above. Therefore, there is some limit beyond which the stress level in the substrate may not be desirable. Furthermore, it takes a matter of time to grow the polycrystalline film. Obviously, the shorter the processing time the better. Therefore, it is preferred that the thickness is less than about 50,000 Angstroms. The lower limit of the thickness is 1,000 Angstroms because the grain boundary area is approximately directly proportional to the thickness of the polysilicon layer, and may become insufficient for typical contamination. For polysilicon layers without silicon nitride capping, a 5,000 Angstroms thickness would be the lower limit because of polysilicon removal by steps of thermal oxidation and etching during device processing.

Figure 2:
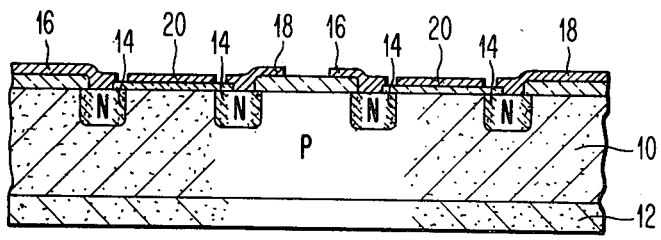
FIG. 2 shows an integrated circuit device having n-channel MOSFET metal oxide semiconductor field effect transistor devices on the major surface opposite to the polycrystalline film.

Referring now to FIG. 2, a first embodiment of the present invention is described wherein a metal oxide semiconductor field effect transistor integrated circuit (MOSFET) is shown. The FIG. 1 structure having the polycrystalline silicon layer 12 on one major surface has its surface oxidized by placing the whole body into an ambient containing an oxidizing atmosphere such as oxygen and/or water vapor at a temperature of 970° C. The oxidation is continued until a layer of approximately 3000 Angstroms is grown on the major surface opposite to that of the polycrystalline silicon. A photoresist material is then applied over the silicon dioxide on the surface opposite to that of the polycrystalline silicon layer 12, exposed through a photomask and developed. Chemical etching is utilized to remove the silicon dioxide in the areas where "sources" and "drains" of the MOSFETs are to be formed. An N-type impurity, such as arsenic or phosphorus is diffused or ion implanted through the openings in the oxide to form N source and drain regions 14. The gate oxide is removed using photoresist and etching techniques and a thin gate silicon dioxide having a thickness of from 500 to 1500 Angstroms is grown for each of the MOSFETs in the integrated circuit. Photoresist and etching techniques are utilized to remove oxide to form openings within but not overlapping the source-drain diffusions for electrical contact. A layer of aluminum between about one to two microns in thickness is deposited over the entire wafer surface using suitable evaporation equipment. Conventional photoresist and etching techniques are then utilized to form the conductor lines on the surface of the wafer to connect the various MOSFET devices into desired circuit configurations. The source contact 16 and drain contacts 18 and gate electrode 20 form each N-channel MOSFET device. One variation of the above described MOSFET structure involves the deposition of a doped polysilicon gate over a nitride-oxide gate dielectric.

During these processing steps the temperature seen by the semiconductor body 10 and polycrystalline layer 12 are for the N-type diffusion 870° C, the oxidation steps 970° C and 1000° C and the post-aluminum annealing at 400° C. During the temperature cycling, the getterable impurities such as copper, lithium, sodium, potassium, iron, cobalt, nickel, chromium, and gold will diffuse to, and become trapped in, the polycrystalline silicon film impurity sink, thus relieving the integrated circuit region of these contaminants which have an adverse effect on yield. Another yield detracting defect, oxidation stacking faults also have been found to be removed due to the temperature cyclin with the polycrystalline silicon on the back surface.

Figure 3:
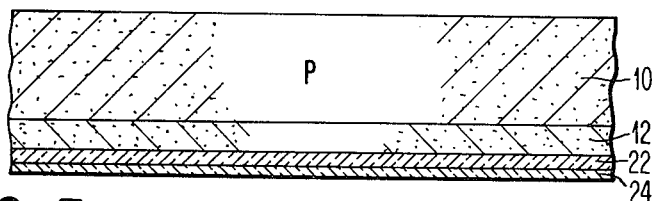
FIGS. 3 and 4 illustrate another embodiment of the present invention wherein a polycrystalline silicon layer capped by a contamination impervious film is utilized in the manufacture of bipolar semiconductor devices.
Figure 4:
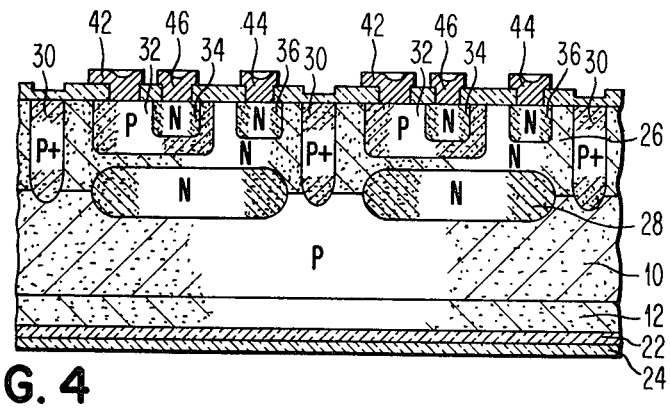

Referring now to FIGS. 3 and 4, a second emobidment of the present invention describes the manufacture of bipolar devices. Formed on the polycrystalline silicon layer 12 is a silicon dioxide layer 22. The silicon dioxide layer 22 can be formed by oxidation as described in the above paragraph. Over the silicon dioxide layer 22 is a substantially contaminant impervious film such as amorphous silicon nitride, aluminum trioxide or silicon oxynitride layer 24. An amorphous silicon nitride layer can, for example, be formed by the pyrolytic reaction between silane and ammonia. The temperature for silicon nitride deposition can vary between 650° C and 1000° C. An example of the process conditions are, in a horizontal pyrolytic reactor: nitrogen (carrier gas) flow, eight liters per minute; $SiH_4$ (10% concentration), 130 cc per minute; $NH_3$, 1.8 liters per minute; deposition temperature, 800° C; deposition time, 10 minutes. This process deposits a silicon nitride layer of 1500 Angstrom units.

The silicon dioxide layer 22 may or may not be formed on the polycrystalline layer 12. However, the layer 24 is a necessary layer particularly when the polycrystalline silicon layer 12 would be subjected to an external source of impurities, such as may be found when the body is placed onto the susceptor of an epitaxial growth chamber. The preferred thickness of the silicon nitride layer is between about 300 Angstrom units to 2000 Angstrom units. The silicon dioxide layer, if present, has a preferred thickness of about 5000 Angstrom units.

Capping polysilicon gettering layers with thin, impurity-impervious layers such as silicon nitride layers can further and significantly improve the former's gettering effectiveness. The reason that capping of a polysilicon film would work to improve yield by preventing the polysilicon from being saturated by contaminants is as follows: In the case of epitaxial growth, where the front surface of a wafer is fully exposed, the contaminant mainly comes from the heated susceptor which is in contact with the backside of the wafer. Assume the contaminant to attain a gas phase concentration $C_o$ at the gas/susceptor interface, this will be the concentration that causes the saturation of the polysilicon if it is in direct contact with the susceptor. On the other hand the contaminant in the bulk of the gas phase may only attain a steady-state concentration C of $$C = \frac{\frac{kA}{v}}{1 + \frac{kA}{v}} C_o;$$

$$\approx \frac{kA}{v} C_o << C_o \text{ if } \frac{kA}{v} << 1,$$

where $k$ is a rate constant, and is either given by the evaporation coefficient of the contaminant, or by $D/y$, the latter case being appropriate when the evaporation rate is fast, and diffusion through the boundary layer is rate controlling. In this expression, $D$ is the gas phase diffusivity, about 1 cm²/sec; $y$ is the appropriate boundary layer thickness taken as about 10 cm; $v$ is the hydrogen flow rate, $1.7 \times 10^3$/sec; and $A$ is the exposed surface area of the susceptor, about 0.1 m². Capping the polysilicon layer with impurity impervious film such as silicon nitride will limit the contamination to the gase phase bulk conentration C, or frequently less. In the case of thermal processing in tubular furnaces the contaminant comes from the heated quartz tubes in all directions. But now the front surface of a wafer is no longer fully exposed, and has only limited entrance for the contaminant. Further, the non-epi processing temperatures are usually somewhat lower, making contamination from the front not very likely. Therefore, capping the traditionally bare backsides of wafers, or the backside polysilicon layers as in this invention, should be sufficiently efficient in preventing contamination of wafers during thermal processing.

To form bipolar structure as shown in FIG. 4, the structure in FIG. 3 is placed in an oxidizing ambient such as oxygen and water vapor at a temperature of about 970° C. Approximately a 3000–4000 Angstroms silicon dioxide layer is formed on the surfaces not covered by the contaminant impervious film 24. Through the use of conventional photoresist and etching techniques, openings are made in the oxide in the regions where the subcollector is to be formed. An n-type dopant such as arsenic or phosphorus, is either diffused or implanted through these openings. The structure is then re-oxidized to give a total thickness of an approximately 5000 Angstroms silicon dioxide layer. Again through the use of conventional photoresist and etching technique, openings are made in the regions where the isolation pockets 30 are to be made. After the diffusion of a P-type dopant, for example boron, to form the isolations, the oxide on the surface is then removed by chemical etching. The body is placed in a susceptor of an epitaxial growth furnace and the epitaxial layer 26 is grown on the body 10. This epitaxial layer is of N-type as shown in this Example. The N-type dopant in the substrate partially outdiffuses into the epitaxial layer to form the subcollector 28 for each of the bipolar devices to be made.

The semiconductor body is subjected to an oxidation ambient of, for example, oxygen and water vapor at a temperature of about 970° C, for a time sufficient to form a silicon dioxide layer of approximately 3000 Angstroms thereon. Openings are made in the silicon dioxide layer by suitable photoresist and etching techniques and P+ isolation diffusions 30, for example, of boron material are formed to isolate the semiconductor devices to be made from one another. The surface is reoxidized and other openings are formed in the oxide to form the base regions 32, the emitter regions 34 and the collector contact region 36 by conventional diffusion or ion implantation processes. The emitter and collector contact may be formed by one diffusion of N-type arsenic or phosphorus material. Photoresist and etching techniques are utilized to remove oxide from the emitter, base and collector contacts areas. A layer of aluminum is deposited over the entire wafer surface using suitable evaporation equipment. Conventional photoresist and etching techniques are then utilized to form the conductor lines on the surface of the wafer to connect the various devices into circuit configurations. The emitter contact 46, base contact 42, and collector contact 44 forms the bipolar transistor. The base diffusion is formed as P-type in this example which may be a boron dopant. Through similar techniques, the reverse polarity devices, that is PNP, may be formed.

During the processing, the polycrystalline layer 12 which was capped by contaminant impervious layer 24 will have experienced a wide range of temperatures, e.g. 800°–1100° C for the various diffusions, 1150° C for the epitaxial reaction, and 970° C for the oxidation. During these temperature cyclings, contaminant impurities, as well as point defects responsible for the formation of stacking faults, are gettered to the polycrystalline silicon as described in the first embodiment.

Although the second example involved the manufacture of a bipolar device, it should be understood that it could be helpful to use a substantially contaminant impervious film such as silicon nitride, aluminum oxide or silicon oxynitride in the formation of MOSFET devices or other devices involving resistors and capacitors.

The following Examples are included merely to aid in the understanding of the invention and variations may be made by one skilled in the art without departing from the spirit and the scope of the invention.

EXAMPLE 1

Figure 5:
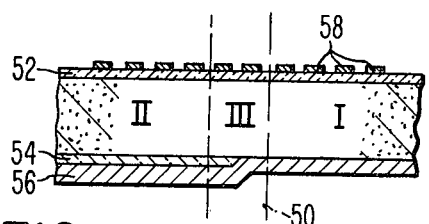
FIG. 5 illustrates a test structure for experiments utilizing the polycrystalline silicon gettering for MOS field effect devices.

<100> P-type 10 ohm-cm silicon wafers of 57 mm diameter were cleaned sequentially first in a $NH_4OH$—$H_2O_2$ aqueous solution, then in a HCl—$H_2O_2$ aqueous solution, with intervening and end rinsings with deionized water. These were then oxidized at 970° C in the ambients, sequentially, dry oxygen for 5 minutes, steam 60 minutes; and dry oxygen 5 minutes to form 2700 Angstroms of $SiO_2$ films on both sides of each wafer. Then, in the first set, Example 1, half of the oxide film on the backside of each wafer was etched off. Then polycrystalline silicon films of 1.6 μm thickness were deposited on the backsides of these samples, forming a structure as shown in FIG. 5 wherein the silicon wafer 50 has an oxide layer on frontside 52 and backside 54. A 1.6 μm polycrystalline layer 56 covers the entire backside. To make MOS test capacitors, a 10 × 10 matrix of 60 mil diameter aluminum dots 58 are formed on the front side over silicon oxide layer 52 by vacuum deposition of aluminum through a tantalum dot mask.

In the structure in FIG. 5 and Map, it was expected that gettering would take place in region I, but not in region II because of the presence of an intermediary oxide barrier. Thus, region II served as a control. A transition region was anticipated, and was called region III.

The polycrystalline silicon films were deposited in a radiant-heated horizontal chemical vapor deposition reactor at 650° C by the pyrolysis of silane ($SiH_4$). The deposition conditions were $SiH_4$ flow rate 55 cc/min., nitrogen carrier gas 60 l/min., deposition rate 225 A/min. The grain size of the films was analyzed by means of both transmission electron microscopy and X-ray diffraction line-broadening, and was found to be approximately 1000 Angstroms.

The effectiveness of the gettering process was evaluated on the basis of the reduction in leakage currents arising from electron-hole pairs generations in the depletion regions of devices, when the device is appropriately biased. Such electron-hole pairs are usually generated at the locations where contaminants have accumulated. The removal of such contaminants by means of gettering therefor can reduce the generation currents. Depending on the type of devices, high generation currents above certain values lead to device failure, and are not acceptable. In this work, the generation currents were measured by the well known method of capacitance relaxation of pulse-depleted MOS capacitors, as described in the literature, for example, M. Zerbst, Z. Angew.Phys. 22, 30(1966); F. P. Heiman, IEEE Trans.

Electron Devices, ED-14, 781 (1967); D. K. Schroder and J. Guldberg, Solid-State Electronics, 13, 1285 (1971); W. P. Fahner and C. P. Schneider, J. Electrochem. Soc. 123, 100 (1976). The generation current $j_{gen}$ is conveniently related to the rate of capacitance relaxation of the pulses MOS capacitor. We define the generation current at the incipient relaxation, commencing at a silicon surface potential of 10 volts. The generation currents of all the MOS capacitors in each sample are then averaged logarithmically; that is, a geometric mean of the generation current is taken for each sample. Whereas we have chosen the generation current most other investigations have chosen the generation lifetime $\tau_{gen}$ for the evaluation of gettering. The relationship between the generation current and the generation lifetime, under an ideal assumption, is a simple reciprocal proportionality, i.e. $j_{gen} = q\, n_i (\omega - \omega_\infty) \tau_{gen}$, where $q$ is the charge of an electron, $n_i$ is the intrinsic carrier concentration, $\omega$ is the width of the depletion layer at the incipient relaxation, and $\omega_\infty$ is the width of the depletion layer under equilibrium (for example, see W. Zechnall and W. M. Werner, Solid-State Electronics, 18, 971 (1975)).

A generation current map, in generation current density nano amp/cm² for the structure is as follows:

|     | 1   | 2   | 3   | 4   | 5    | 6   | 7   | 8   | 9   | 10  |
|-----|-----|-----|-----|-----|------|-----|-----|-----|-----|-----|
| 1   | 192 | 110 | 88  | 88  | (?)  | 3.3 | 1.6 | 3.3 | 3.3 | (?) |
| 2   | 121 | (?) | 66  | 66  | 6.6  | 1.6 | 0.5 | 1.6 | 1.6 | 1.6 |
| 3   | 88  | 66  | 66  | 66  | (?)  | 0.5 | 1.6 | (?) | 11  | 1.6 |
| 4   | 110 | 88  | 66  | 66  | 6.6  | 1.6 | 5.0 | 1.6 | 1.6 | 3.3 |
| 5   | (?) | 88  | 88  | (?) | 11   | 0.5 | 0.5 | 1.6 | (?) | (?) |
| 6   | 110 | 88  | 88  | (?) | 16.4 | 3.3 | 0.5 | 1.6 | (?) | (?) |
| 7   | 137 | 137 | 88  | (?) | 11   | 0.5 | 3.3 | 1.6 | (?) | 0.5 |
| 8   | 192 | 99  | 88  | (?) | 8.8  | (?) | 1.6 | 1.6 | 0.5 | 0.5 |
| 9   | 219 | (?) | (?) | (?) | (?)  | (?) | 3.3 | 1.6 | 1.6 | 3.3 |
| 10  | 312 | 247 | 411 | (?) | 6.6  | (?) | (?) | 1.6 | 1.6 | (?) |
|     |     | II  |     |     | III  |     |     | I   |     |     |

The capacitors marked with "(?)" are anomalous units that could have been caused by a number of reasons, such as leakage oxides, rather than defect generation currents. Hence, they have been excluded. It can be seen that the generation current has been reduced by nearly two orders of magnitude as a result of the polycrystalline silicon gettering in region I. The geometric means of the leakage currents for the three regions are summarized in Table I.

TABLE I

| Column | Region | Mean Generation Current Nano Amp/cm² | Remarks |
|--------|--------|--------------------------------------|---------|
| 1-4    | II     | 108                                  | ungettered |
| 5-6    | III    | 3.4                                  | transition region |
| 7-10   | I      | 1.7                                  | gettered |

EXAMPLE 2

A polycrystalline silicon film of nominal thickness 1.5 micrometers was deposited on each of the A and C quarters of 2¼ inch diameter silicon wafers at temperatures of 650° C, 700° C and 750° C for the evaluation of the effect of polysilicon deposition temperature on the gettering efficacy. The B quarters were for testing another gettering technique different from this invention, and the D quarters were controls. After polycrystalline silicon deposition, the A quarters were annealed in nitrogen at 900° C for 1 hour. The B quarters were for annealing at a higher temperature. The gettering efficiency, as evaluated by means of pulsed MOS capacitance relaxation described above and in more detail elsewhere in the literature, is summarized in terms of improvement in generation currents versus the controls in Table II.

TABLE II

| | | Average Generation Currents In Nano Amps/cm² | | | |
|---|---|---|---|---|---|
| Wafer No. | Deposition Temperature | A Quarters Polysilicon Gettering at 900° C | Average* For Each Group of Polysilicon Gettering | D Quarters control | Group* Average For Controls |
| A | 650° C | 0.79 | | 811 | |
| B | 650° C | 0.84 | 0.77 | 1113 | 523 |
| C | 650° C | 0.70 | | 159 | |
| D | 700° C | 1.6 | | 1.04 | |
| E | 700° C | 3.15 | 2.36 | 2719 | 134 |
| F | 700° C | 2.6 | | 850 | |
| G | 750° C | 1.55 | | 503 | |
| H | 750° C | 2.4 | 2.47 | 5153 | 516 |
| I | 750° C | 4.06 | | 53 | |

*Average for each group is taken by geometric means

This Example shows that the gettering efficiency is excellent for all the deposition temperatures investigated. However, there is an indication of a slight decrease in gettering efficiency at higher deposition temperatures.

EXAMPLE 3

The lowering of deposition temperatures increases the severity in the problems of "creeping" and stresses generated in the polycrystalline silicon films as well as in the substrates. Polycrystalline silicon films were deposited on the conventional backsides of 2¼ inch diameter silicon wafers at temperatures ranging from 550° C to 750° C, for a nominal thickness of 1.5 micrometers. It is noted that at the deposition temperature of 550° C, the polycrystalline silicon film was substantially less than a micron, due to unduly low deposition rate. The "creeping distance" as defined above for the various deposition temperatures is tabulated in Table III:

TABLE III

| Temperature (° C) | Creeping Distance (mm) |
|-------------------|------------------------|
| 550°              | 10                     |
| 650°              | 2                      |
| 700°              | 1                      |
| 750°              | 0.4                    |

At the lower temperatures the pyrolysis of silane was so slow that polycrystalline silicon creeped for a long distance into the gap between the susceptor and the front surface of the wafer (face down its exhaustion, thus depositing polysilicon along the wafer edge.

EXAMPLE 4

A polysilicon film of a nominal thickness of 1.5 micrometers (μm) was deposited on 2¼ inch wafers which had been placed in a susceptor, heated to various temperatures, and silane gas and carrier gas passed thereover to form the polycrystalline film. The Table IV gives the deposition temperatures versus polycrystalline film orientation, stress and grain size:

TABLE IV

| Sample | Dep. Temp. | Orientation | Stress (psi) | Grain Size |
|--------|------------|-------------|--------------|------------|
| A      | 550        | random      | 25,000       | —          |
| B      | 620        | random      | 35,000       | —          |
| C      | 650        | random      | 21,000       | —          |
| D      | 680        | [110]       | 5,000        | 574 A      |

TABLE IV-continued

| Sample | Dep. Temp. | Orientation | Stress (psi) | Grain Size |
|---|---|---|---|---|
| E | 720 | [110] | 12,000 | 630 A |

It is seen from Table IV that at deposition temperatures of 650° C or lower, there exists very high stresses in the polycrystalline silicon films which correspondingly introduce high stresses in silicon substrate wafers. If the polycrystalline silicon films are fairly thick, say 3 $\mu$m or more, such stresses in the polycrystalline silicon films may induce warpage and dislocations in the silicon substrates. The abrupt drop of polycrystalline silicon film stress at and above 680° C deposition temperatures is explained by a preference of a different ordering of grain structure. There is a high percentage of preferred [110] orientation perpendicular to the surface plane of the silicon substrate (001). Such partial ordering, while retaining the randomness in the rotations of the crystallines and the grain size, is the reason for the decrease of intrinsic stresses in the polysilicon films.

EXAMPLE 5

The ability of polycrystalline silicon layers at all practical processing temperatures, at least up to and including 1175° C was analyzed herein. P-type 2 ohm-cm silicon wafers of 2¼-inch diameter were thermally oxidized to produce about 3700 A silicon dioxide surface films. The backside oxide films were subsequently removed; the front oxide films served to protect the front surfaces of the wafers from mechanical damage during polycrystalline silicon deposition. A 1 $\mu$m polycrystalline silicon film was deposited at 700° C on the backsides. The wafers were then reoxidized to give a final oxide thickness of 5000 A on the front surface. The wafers were then gettered for 30 minutes in a nitrogen ambient at various temperatures (1000–1175° C) and subsequently quenched in air. Using the method of evaluation of gettering efficiency in terms of generation currents, as described in Example 1, the results are given in Table V:

TABLE V

| Gettering Temperature, ° C | Mean Generation Currents of Individual Samples Nano Amps/cm$^2$ | | | Group Mean Generation Current Nano Amps/cm$^2$ |
|---|---|---|---|---|
| 1000 | 18.9, | 8.55, | 5.2 | 9.4 |
| 1050 | 1.63, | 2.23, | 1.32 | 1.7 |
| 1100 | 6.3, | 3.26, | 6.6 | 5.1 |
| 1150 | 5.47, | 4.22, | 3.07 | 4.1 |
| 1175 | 5.04, | 4.96, | 3.5 | 4.4 |

It is seen from the above Table that the generation current has been reduced to below 10 Nano Amps/cm$^2$ after gettering with polysilicon films at all temperatures tested.

EXAMPLE 6

The samples were prepared with wafers of 2¼ inch diameter, P-type 2 ohm-cm <100> silicon. They were cleaned using acidic and basic hydrogen peroxide solutions at the start of the processing sequence. The frontside of the wafers were protected by an approximately 5000 A layer of pyrolytic SiO$_2$ film which was deposited at 800° C under the conditions: nitrogen flow, 54 liters per minute, SiH$_4$ (10%), 52 cc per minute; N$_2$O, 1 liter per minute; deposition time, 30 minutes. A 1.5 micrometer layer of polycrystalline silicon was deposited at 700° C by the technique described in Example 1 on the backside of each of the wafers in groups 1-A, 2-A, 1-B, 2-B. The polysilicon films on the wafers in 1-A and 2-A were then capped by a 1500 A layer of silicon nitride deposited at 800° C. The condition for silicon nitride deposition was as described above on page 12, lines 20–27 and on page 13, lines 1–2. The silicon dioxide on front of the wafers was then removed. Wafers in groups 1-C and 2-C are controls, which had neither polysilicon nor silicon nitride films. Then, 2 $\mu$m n$^-$epi layers (0.3 ohm-cm) were grown on wafers in groups 1-A, 1-B and 1-C at 1150° C, while wafers in groups 2-A, 2-B and 2-C were given simulated epi processing at 1150° C and the same gas flow rate (100 liters/min. of hydrogen) except without silicon tetrachloride, and hence without actual epitaxial growth. 3000 A layers of thermal oxide were then grown on all the wafers at 1000° C, followed by deposition of aluminum electrodes of both 60 and 20 mil dots, followed by 400° C annealing in forming gas. Because of the higher leakage currents usually found after epitaxy processing, the pulsed MOS capacitance relaxation measurements were evaluated on 20 mil dots. The results are given in Table VI. From these results, we see that epitaxy simulation as well as actual epitaxial growth resulted in very high generation currents (10$^3$ to 10$^5$ Nano Amps/cm$^2$) in the controls, suggesting contamination from the epitaxial susceptor as an important factor in generation lifetime degradation. Polycrystalline silicon without nitride capping improved the generation currents to below 10$^3$ Nano Amps/cm$^2$ (500–800 Nano Amps/cm$^2$) in both the case of actual epitaxial growth and in the case of epitaxy simulation. Poylcrystalline silicon capped with nitride further reduced the generation currents to below 10$^2$ Nano Amps/cm$^2$ (64 and 43 Nano Amps/cm$^2$ respectively).

TABLE VI

| Processing | Group | | Samples | Average Generation Currents Nano Amps/cm$^2$ |
|---|---|---|---|---|
| | 1-A | Polysilicon With Nitride Capping | 1 2 3 | 121 47 47 |
| Epitaxial Growth | | | Group Average | 64.4 |
| | 1-B | Polysilicon Only | 1 | 552 |
| | | | Group Average | 552 |
| | 1-C | Control | 1 2 3 | 2.28 × 10$^3$ 1.06 × 10$^5$ 2.83 × 10$^3$ |
| | | | Group Average | 8.8 × 10$^3$ |
| | 2-A | Polysilicon | 1 | 71.5 |

TABLE VI-continued

| Processing | Group | | Samples | Average Generation Currents Nano Amps/cm² |
|---|---|---|---|---|
| Epitaxial Simulation | With Nitride Capping | | 2 | 36.5 |
| | | | 3 | 30.6 |
| | | Group Average | | 43.1 |
| | 2-B | Polysilicon Only | 1 | 587 |
| | | | 2 | 834 |
| | | Group Average | | 699 |
| | 2-C | Control | 1 | 2.88 × 10⁴ |
| | | | 2 | 7.7 × 10⁴ |
| | | | 3 | 7.99 × 10⁴ |
| | | Group Average | | 5.6 × 10⁴ |

EXAMPLE 7

Figure 6:
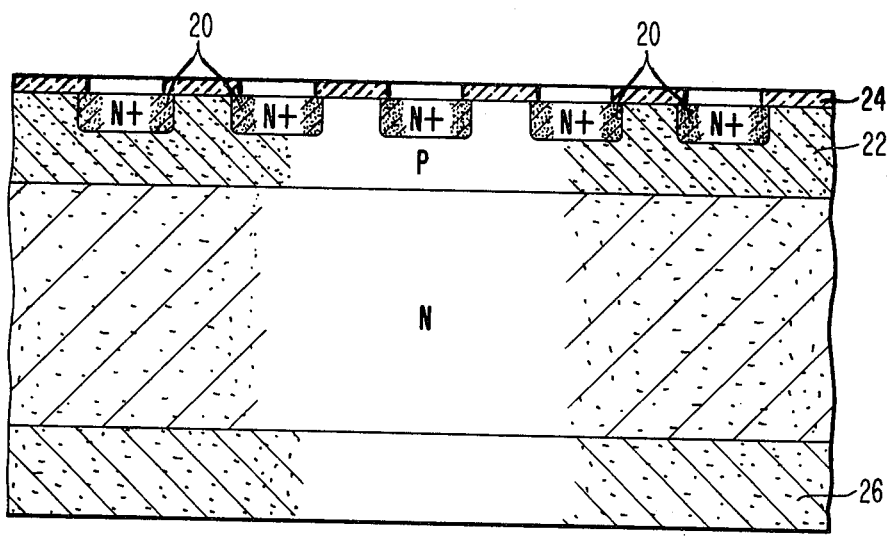
FIGS. 6 and 7A & B illustrate yet another test structure and yield map for experiments utilizing the polycrystalline silicon gettering of bipolar devices.
Figure 7A:
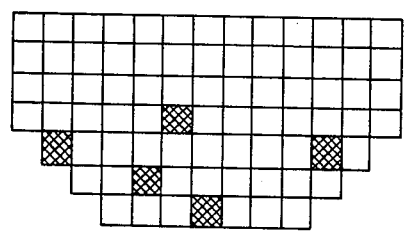
Figure 7B:
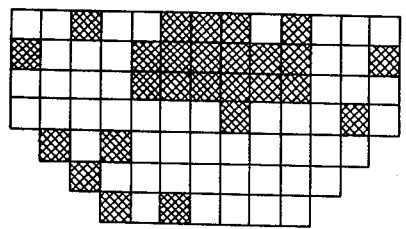

The test structure used to demonstrate the effectiveness of a backside polycrystalline silicon gettering layer in improving the yield of bipolar device integrated circuits is shown in FIG. 6. This test structure is a simplified version of typical bipolar device integrated circuits such as shown in FIG. 4. The test structure is a chip that consisted of groups of multiple emitters 20 on a common base 22. The substrates were N-type <100> silicon wafers with a resistivity of about 1 ohm-cm. The wafers were split into two groups. A 1.5 μm layer of polycrystalline silicon was then deposited on each of Group A substrates at 700° C, using the process as described in Example 6. Group B substrates served as control, and were processed together with Group A wafers hereafter. The structure of Group B is similar to FIG. 6, except without the polysilicon layer 26. The base was formed by diffusing into the substrate boron dopant at 1050° C for 35 minutes, with a boron surface concentration of approximately 2.9 × 10¹⁹ atoms per cubic centimeter, followed by a drive-in process in dry oxygen-steam-dry oxygen at 970° C for 80-50-5 minutes respectively. Multiple emitter openings were then etched into the silicon dioxide film 24 that was grown thermally during the boron drive-in process by means of conventional photoresist and chemical etching. Emitters were formed by arsenic diffusion at 1100° C for 50 minutes, with a surface concentration of approximately 7 × 10²⁰ atoms per cc. This resulted in an emitter depth of approximately 0.7 microns, and a base width of approximately 0.5 microns. Electrical leakages in the devices were then mapped electrolytically, and examined under optical microscopy. Any "chip" which contained one or more emitters that were leaky was counted as a failed chip. In this manner, a yield map was obtained for each sample. FIG. 7A shows a yield map for half a wafer from Group A that had a back-side polycrystalline silicon gettering layer 26, and the yield map of FIG. 7B half a wafer from Group B that did not have polycrystalline silicon on the backside. Each shaded square grid represents a failed chip. The control (B) showed a yield of 67%, corresponding to a defect density of 0.0011 defect per square mil (assuming a Poisson's statistics), while the gettered sample (A) had a yield of 94.6%, corresponding to a defect density of 0.00017 per square mil.

EXAMPLE 8

This Example demonstrates the efficacy of a backside polycrystalline silicon layer in the prevention or reduction of the formation of oxidation stacking faults. Wafers of P-type 2 ohm-cm <100> silicon, 2¼ inch diameter had their back and front surfaces polished. They were oxidized at 970° C in an oxidizing ambient to form a surface silicon dioxide film of 2000 Å. The oxide on one surface was then etched photolithographically into square openings in the form of checkerboard pattern, having a periodicity of 400 μm. Then a 1.5 μm layer of polycrystalline silicon was deposited over the oxide checkerboard pattern, using the process described earlier in this document. Where the pattern in the oxide was open, the polycrystalline silicon was in direct contact with the silicon substrate, and hence exerted its gettering effect; where the pattern in the oxide was not opened, the polycrystalline silicon was prevented from directly contacting the silicon substrate, thus could not exert its gettering action. The oxide on the frontside of the wafer was then removed in a buffered HF solution. After suitable cleaning, the sample was then oxidized in dry oxygen at 1050° C for 5 hours. To reveal oxidation stacking faults, the sample was etched in a sirtl etch for 2 minutes, and examined under optical microscope. The etched figures of the stacking faults are readily recognized this way (for example, see S. M. Hu, Appl. Phys. Lett. 27, 165(1975)). The oxidation stacking faults were observed to be confined essentially in the areas of squares where the oxide on the opposite surface was kept between the polycrystalline silicon and the substrate; the areas of squares where the oxide on the opposite surface had been removed, and hence the polycrystalline silicon was in direct contact with the substrate, were essentially denuded of oxidation stacking faults. Macroscopically visualized, the frontside exhibited in a dramatic and eloquent way, a checkerboard pattern of square areas of alternating grids of hazy patches loaded with oxidation stacking faults, and grids of clear patches free of stacking faults; the checkerboard pattern on the front is exactly complementary to that in the back surface. Thus, this example had demonstrated that an area of a polycrystalline silicon gettering film on the backside of a wafer can prevent or reduce the formation of oxidation stacking faults on its opposite surface.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. The method for gettering impurities and for removal of point defects from silicon semiconductor material comprising:
   providing a body of monocrystalline silicon material suitable for forming semiconductor devices therein;
   depositing a layer of polycrystalline silicon on one major surface of said body by hydrogen reduction of a silicon-containing gas which is passed over said body along with a inert carrier gas while said body is maintained at a temperature between about 600° C to 800° C;

said layer being predominently oriented to one crystallographic orientation; and forming semiconductor devices on the major surface opposite to the said one major surface of said body which involve processing temperatures between about 800° C to 1100° C.

2. The method of claim 1 wherein the temperature for depositing said layer is between about 680° C and 800° C and the thickness of said layer being between about 5000 A and 50000 A.

3. The method of claim 1 wherein a substantially contaminant impervious film is deposited over said layer of polycrystalline silicon.

4. The method of claim 3 wherein said film is amorphous silicon nitride.

5. The method of claim 3 wherein a silicon dioxide layer is formed on said layer of polycrystalline silicon before depositing said silicon nitride film.

6. The method of claim 3 wherein the said impervious film is aluminum trioxide.

7. The method of claim 3 wherein the said impervious film is amorphous silicon oxynitride.

8. The method of claim 3 wherein the thickness of said impervious film is between about 300 Angstroms and 2000 Angstroms.

9. The method of claim 1 wherein said semiconductor devices are metal oxide silicon field effect transistors.

10. The method of claim 3 wherein said body is silicon and one of the steps in forming said semiconductor devices includes the formation of an epitaxial silicon layer.

11. The method of claim 1 wherein the orientation of said body is (011) and the orientation of said layer is predominently [110] and average grain size of less than about 1 micrometer.

* * * * *